United States Patent

Watanabe et al.

[11] Patent Number: 6,073,449
[45] Date of Patent: Jun. 13, 2000

[54] THERMOELECTRIC APPARATUS

[75] Inventors: Hideo Watanabe, Kawasaki; Hirofusa Tezuka, Noboribetsu; Mitsutoshi Ogasawara, Muroran; Nobuhiko Suzuki; Kazuya Sato, both of Noboribetsu, all of Japan

[73] Assignee: Technova Inc., Tokyo, Japan

[21] Appl. No.: 08/881,760

[22] Filed: Jun. 24, 1997

[30] Foreign Application Priority Data

Jun. 25, 1996 [JP] Japan .................................. 8-164486

[51] Int. Cl.$^7$ ..................................................... F25B 21/02
[52] U.S. Cl. ................................................................ 62/3.2
[58] Field of Search ................................ 62/3.2, 3.3, 3.6, 62/3.7; 136/204

[56] References Cited

U.S. PATENT DOCUMENTS

| | | | |
|---|---|---|---|
| 3,212,274 | 10/1965 | Eidus | 62/3.7 |
| 4,497,973 | 2/1985 | Heath et al. | |
| 5,724,818 | 3/1998 | Iwata et al. | 62/3.7 |
| 5,865,031 | 2/1999 | Itakura | 62/3.7 |

*Primary Examiner*—Henry Bennett
*Assistant Examiner*—Melvin Jones
*Attorney, Agent, or Firm*—Evenson, McKeown, Edwards & Lenahan, PLLC

[57] ABSTRACT

A thermoelectric apparatus is composed of a heat-absorbing-side heat-exchanging base and a heat-dissipating-side heat-exchanging base having good thermal conductivity and arranged in a mutually opposing relationship with a group of thermoelectric elements interposed therebetween. The thermoelectric apparatus comprises a frame made of a synthetic resin material and holding one of the heat-absorbing-side heat-exchanging base and the heat-dissipating-side heat-exchanging base at an outer peripheral portion thereof. The frame and the other heat-exchanging base, which is not held by the frame, are both provided with extended portions extending substantially along and substantially in the same direction as a stacked direction of the heat-absorbing-side heat-exchanging base, the group of thermoelectric elements and the heat-dissipating-side heat-exchanging base. The extended portions are joined together.

17 Claims, 9 Drawing Sheets

THERMOELECTRIC APPARATUS

BACKGROUND OF THE INVENTION a) Field of the Invention

This invention relates to a thermoelectric apparatus such as a thermoelectric cooling apparatus or a thermoionic electricity generator, and especially to a thermoelectric apparatus which does not undergo much performance degradation even through repeated heat cycles and has excellent operation reliability and long service life.

b) Description of the Related Art

In a conventional thermoelectric apparatus, a group of thermoelectric elements is arranged between thermal conductors, and is fixed in place by fastening the thermal conductors together with plural screws with a thermally-conductive grease applied between each thermal conductor and the group of thermoelectric elements to improve their thermal contact.

As the screws, those made of metal or plastics are used. Metal screws have sufficient strength for the fixing of the group of thermoelectric elements. These metal screws are used in combination of heat-insulating washers because their thermal conductivity is high when used by themselves. On the other hand, plastic screws have low thermal conductivity but due to low mechanical strength, require additional reinforcement by an adhesive or the like.

Fastening force of such screws is needed for assuring thermal conductance between the thermal conductors and the group of thermoelectric elements and also for fixing the group of thermoelectric elements in place. Incidentally, the group of thermoelectric elements is sealed at an outer periphery thereof by silicone rubber or the like for waterproofing.

Since the group of thermoelectric elements is fixed in place by fastening the thermal conductors together with the plural screws in the conventional thermoelectric apparatus as described above, it is difficult to apply uniform pressure to the group of thermoelectric elements. Some of the thermoelectric elements are therefore subjected to localized load, so that they may be broken.

Screws made of a material of relatively low thermal conductivity, for example, stainless steel screws or iron screws are used as the above-described metal screws. The screws of such a material has a smaller coefficient of thermal expansion than the thermal conductors and the thermoelectric elements. During use of the thermoelectric apparatus, the thermal conductors and thermoelectric elements move due to expansion and shrinkage. Such movements of the thermal conductors and thermoelectric elements are restrained by the screws, so that large compression or tensile stress is repeatedly applied to the thermoelectric elements, possibly resulting in breakage of the thermoelectric elements.

Plastic screws, on the other hand, are low in mechanical strength so that they lack long-term reliability. Moreover, they are accompanied by such a drawback that they are unable to provide strength sufficient to withstand a drop and impact test for a thermoelectric apparatus.

SUMMARY OF THE INVENTION

An object of the present invention is to eliminate such drawbacks of the conventional art and to provide a thermoelectric apparatus which undergoes less performance degradation through repeated heat cycles and has excellent operation reliability and long service life.

To achieve the above-described object, the present invention is directed to a thermoelectric apparatus composed of a heat-absorbing-side heat-exchanging base and a heat-dissipating-side heat-exchanging base having good thermal conductivity and arranged in a mutually opposing relationship with a group of thermoelectric elements interposed therebetween.

In a first aspect, the present invention features that the thermoelectric apparatus comprises:

a frame made of a synthetic resin material, for example, polyphenylene sulfide and holding one of the heat-absorbing-side heat-exchanging base and the heat-dissipating-side heat-exchanging base at an outer peripheral portion thereof, wherein the frame and the other heat-exchanging base, which is not held by the frame, are both provided with extended portions extending substantially along and substantially in the same direction as a stacked direction of the heat-absorbing-side heat-exchanging base, the group of thermoelectric elements and the heat-dissipating-side heat-exchanging base; and the extended portions are joined together, for example, with an adhesive or the like.

In a second aspect, the present invention also features that the thermoelectric apparatus comprises:

a heat-absorbing-side frame holding the heat-absorbing-side heat-exchanging base at an outer peripheral portion thereof, and a heat-dissipating-side frame holding the heat-dissipating-side hat-exchanging base at an outer peripheral portion thereof, wherein the heat-absorbing-side frame and the heat-dissipating-side frame are both made of a synthetic resin material, for example, polyphenylene sulfide, and the heat-absorbing-side frame and the heat-dissipating-side frame are both provided with extended portions extending substantially along and substantially in the same direction as a stacked direction of the heat-absorbing-side heat-exchanging base, the group of thermoelectric elements and the heat-dissipating-side heat-exchanging base; and the extended portions are joined together, for example, with an adhesive or the like.

Each frame made of the synthetic resin material has substantially the same level of coefficient of thermal expansion as the thermal conductors and thermoelectric elements so that during operation, the frame undergo expansion and shrinkage to similar extent as the thermal conductors and the group of thermoelectric elements. This has made it possible to significantly reduce the stress which is to be applied to the thermoelectric elements.

Each frame is dimensioned to hold its associated heat-exchanging base at the outer peripheral portion thereof, so that the extended portions are joined together over sufficient areas. Despite each frame is a synthetic resin frame, sufficient fastening force is hence obtained.

Owing to the above-mentioned advantages, the thermoelectric apparatus can be prevented from degradation in performance, thereby providing the thermoelectric apparatus with excellent operation reliability and very long service life.

DETAILED DESCRIPTION OF THE INVENTION AND PREFERRED EMBODIMENTS

The thermoelectric apparatus according to the first embodiment of the present invention will first be described with reference to FIGS. 1 to 3.

Figure 1:
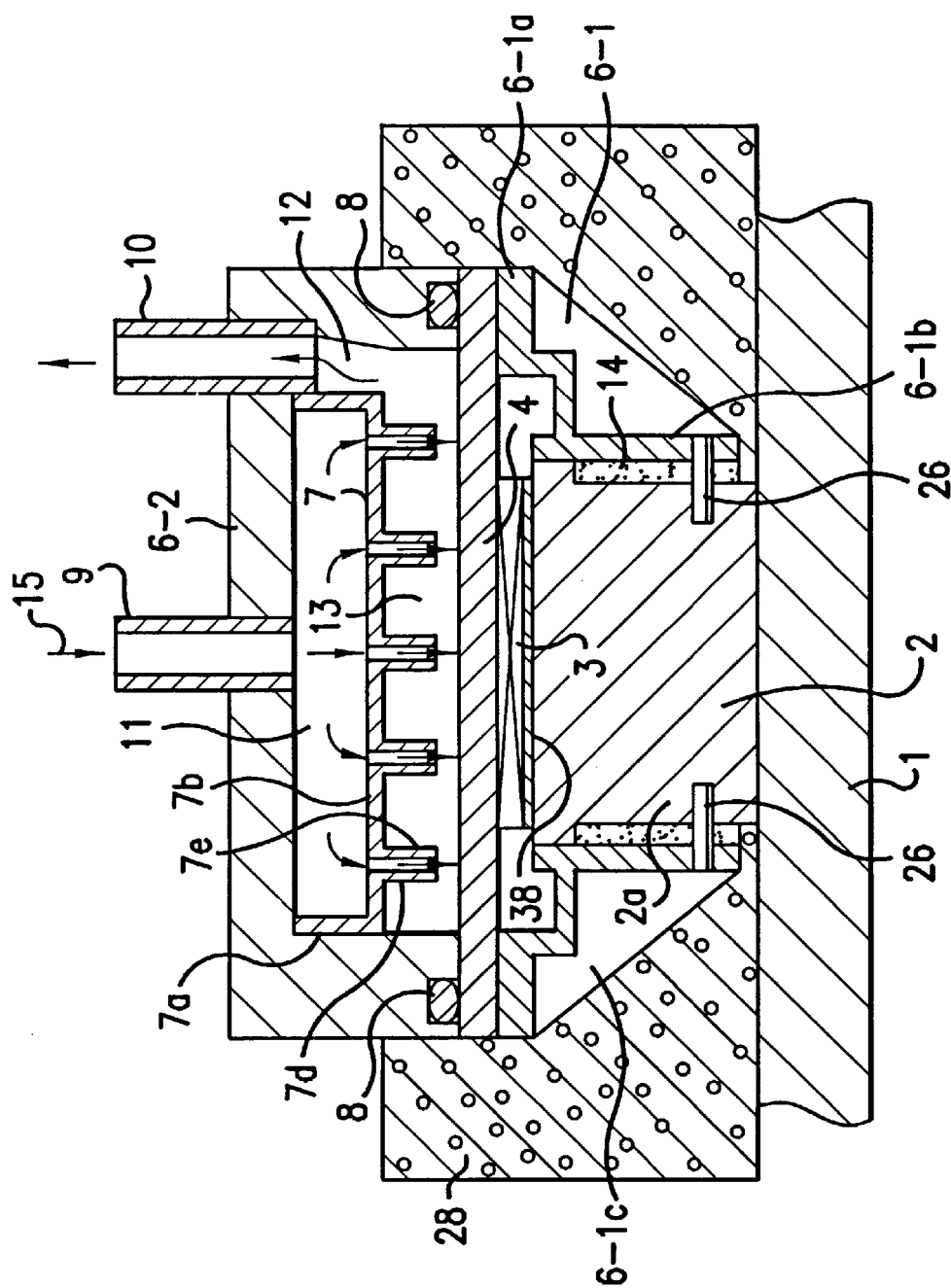
FIG. 1 is a cross-sectional view of a thermoelectric apparatus according to a first embodiment of the present invention, which is useful, for example, as a thermoelectric cooling apparatus such as a thermoelectric refrigerator.

As is illustrated in FIG. 1, the thermoelectric apparatus is composed principally of a heat-absorbing member 1 arranged on a cooled side, for example, one a side of an interior of a refrigerator or the like, a heat-absorbing-side heat-exchanging base 2, a group thermoelectric elements 3, a heat-dissipating-side heat-exchanging base 4, a first heat-dissipating-side frame 6-1, a second heat-dissipating-side frame 6-2, and a distributing member 7.

The heat-absorbing member 1 is formed of a fin base having a wide area and is provided with a number of heat-absorbing fins (not shown). A fan may be arranged in a vicinity of the heat-absorbing member 1 as needed. Further, the fin base may be integrated with the heat-absorbing fins or may be arranged without them.

The heat-absorbing-side heat-exchanging base 2 and the heat-dissipating-side heat-exchanging base 4 are both made of a metal having good thermal conductivity, for example, aluminum or the like, and are provided with electrical insulating films, for example, anodized alumina films on surfaces where they are maintained in contact with the group of thermoelectric elements 3. Upon formation of insulating films of anodized alumina by anodization, omission of sealing treatment is desired because without such sealing treatment, the resultant insulating films can show better joinability with the group of thermoelectric elements 3 via a thin film 38 which will be described subsequently herein. As an alternative, the electric insulating films can also be formed by thermal spraying or the like. A description will be made subsequently herein about other fabrication processes of the heat-exchanging bases 2,4.

As is illustrated in FIG. 1, the heat-absorbing-side heat-exchanging base 2 is composed of a thick block to maintain the base in a well-cooled state.

Although not illustrated in the drawings, the group of thermoelectric elements 3 is constructed of heat-absorbing-side electrodes, heat-dissipating-side electrodes, and numerous P-type semiconductor layers and N-type semiconductor layers arranged between the former and latter electrodes as is known well in the present field of art. The P-type semiconductor layers and the N-type semiconductor layers are arranged in parallel with each other both structurally and thermally, but electrically, they are connected in series via the above-described electrodes.

The first heat-absorbing-side frame 6-1 is arranged extending from the heat-dissipating-side heat-exchanging base 4 to a side of the heat-dissipating-side heat-exchanging base 2 as depicted in FIG. 1, and is in the form of a hollow shape open through top and bottom parts thereof. It has a basal end portion 6-1a and an extended portion 6-1b extending downwardly from an inner peripheral portion of the basal end portion 6-1a. In cross-section, it has approximately a stepped shape. The basal end portion 6-1a is joined in a liquid-tight fashion to a peripheral portion of a lower surface of the heat-dissipating-side heat-exchanging base 4, for example, by using an adhesive or employing an O-ring and an adhesive in combination.

The heat-dissipating-side heat-exchanging base 2 is formed of the thick block as described above, so that its outer peripheral portion forms an extended portion 2a extending substantially along a stacked direction of the heat-absorbing-side heat-exchanging base 2, the group of thermoelectric elements 3 and the heat-dissipating-side heat-exchanging base 4. The extended portion 2a of the heat-dissipating-side heat-exchanging base 2 and the extended portion 6-1b of the first heat-absorbing-side frame 6-1 are opposing to each other in a substantially parallel relationship. By an adhesive layer 14 injected between the extended portions 2a and 6-1b, the heat-dissipating-side heat-exchanging base 2 and the first heat-absorbing-side frame 6-1 are joined integrally. For the adhesive layer 14, a hardening adhesive such as an epoxy adhesive or an acrylic adhesive, a fusion-bonding adhesive such as a hot-melt adhesive, or a like adhesive is usable.

Plural positioning pins 26 extend across the extended portion 2a and the extended portion 6-1b, thereby preventing any relative positional displacement between the heat-absorbing-side heat-exchanging base 2 and the first heat-absorbing-side frame 6-1 even before the adhesive layer 14 hardens completely. Designated at symbol 6-1d in FIG. 2 are pin insertion holes formed through the extended portion 6-1b.

On an outer side of the extended portion 6-1b, plural (four in the illustrated embodiment) reinforcing ribs 6-1c are integrally arranged extending toward the basal end portion 6-1a. As is shown in FIG. 1, the first heat-absorbing-side frame 6-1 is arranged extending over the heat-absorbing-side heat-exchanging base 2 and the heat-dissipating-side heat-exchanging base 4 so that heat returns through the first heat-absorbing-side frame 6-1. For the minimization of this return of heat, it is desired to form the first heat-absorbing-side frame 6-1 relatively thin. A small thickness however leads to a reduction in the mechanical strength of the first heat-absorbing-side frame 6-1. In this embodiment, the plural reinforcing ribs 6-1c are arranged between the basal end portion 6-1a and the extended portion 6-1b to maintain the first heat-absorbing-side frame 6-1 rigid.

Further, the first heat-absorbing-side frame 6-1 is formed in a stepped shape, in other words, in a non-linear shape between the basal end portion 6-1a and the extended portion 6-1b to assure a sufficient creeping distance from the heat-absorbing-side heat-exchanging base 2 to the heat-dissipating-side heat-exchanging base 4, whereby the return of heat through the first heat-absorbing-side frame 6-1 is reduced.

Figure 2:
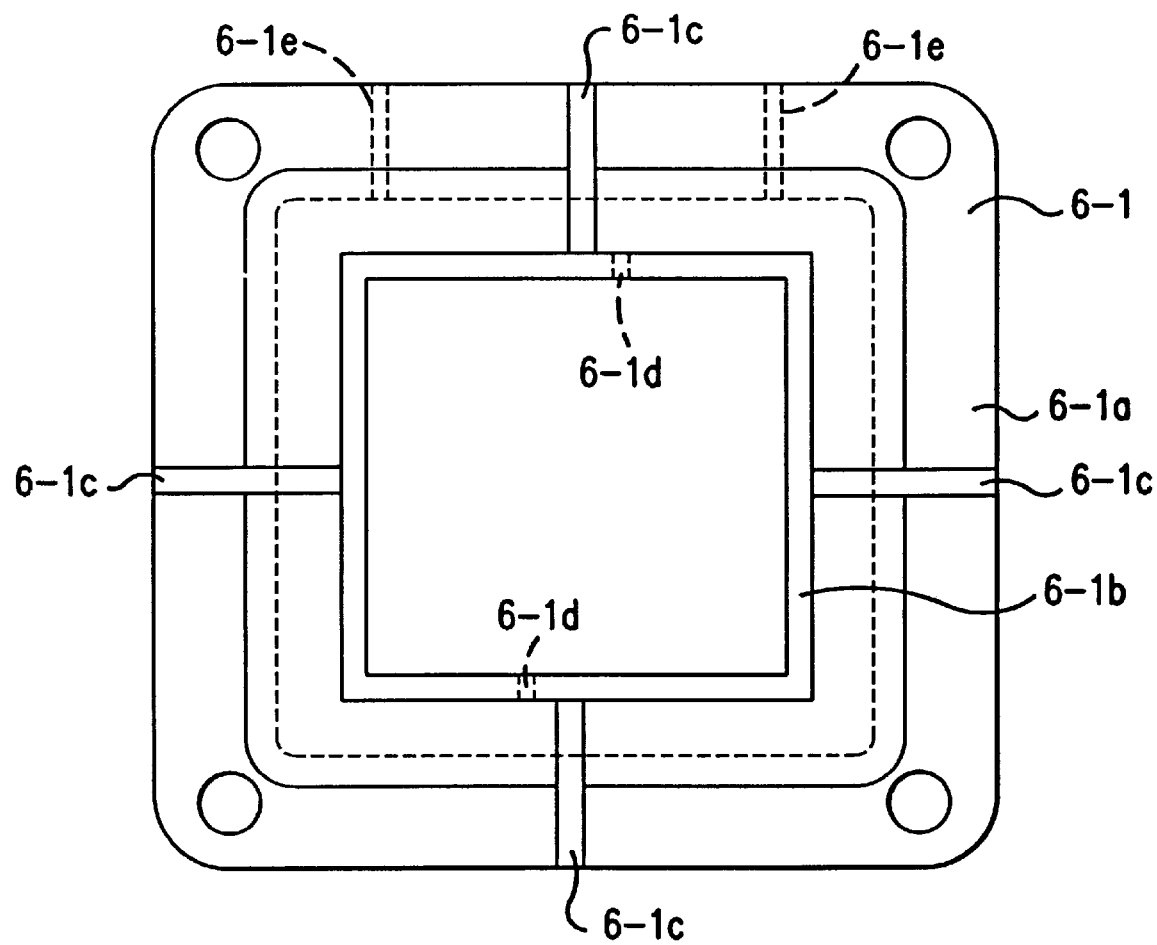
FIG. 2 is a bottom view of a first heat-dissipating-side frame used in the thermoelectric apparatus.
Figure 3:
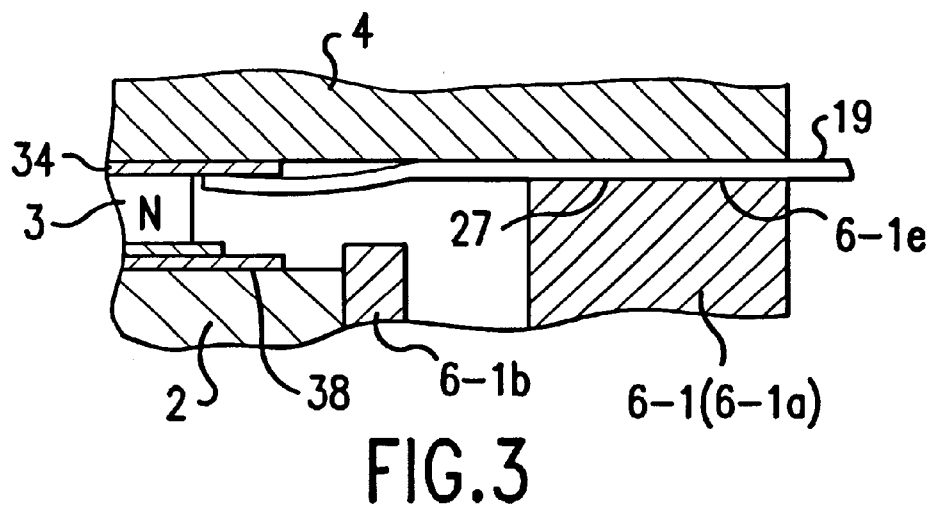
FIG. 3 is a partly-enlarged cross-sectional view for explaining an outlet structure for a lead wire in the thermoelectric apparatus.

As is illustrated in FIG. 2 and FIG. 3, a lead outlet slot 6-1e is formed in the basal end portion 6-1a at a predetermined position. A lead wire 19 (electric power supply member), which is connected to an electrode 34 for the group of thermoelectric elements 3, extends out through the outlet slot 6-1e, and a space between the outlet slot 6-1e and the lead wire 19 is sealed in a gas- and liquid-tight fashion with a sealant 27 (see FIG. 3).

The second heat-dissipating-side frame 6-2 is arranged on an upper side of the heat-dissipating-side heat-exchanging base 4, and is in the form of a hollow shape substantially closed at an upper part thereof but open through a lower part thereof. A peripheral edge portion of a lower opening is bonded in a liquid-tight fashion to a peripheral portion of an upper surface of the heat-dissipating-side heat-exchanging base 4 with an O-ring 8 interposed therebetween. The second heat-dissipating-side frame 6-2 is provided at substantially a central part thereof with a supply pipe 9 and adjacent to a peripheral edge thereof with a drain pipe 10.

The distributing member 7 is provided with a peripheral wall 7a, a bottom wall 7b arranged in continuation with a lower extremity of the peripheral wall 7a, and a number of nozzle portions 7e extending from the bottom wall 7b toward the heat-dissipating-side heat-exchanging base 4. Distributing holes 7d are formed through the nozzle portions 7e, respectively.

By fixing the distributing member 7 within the second heat-dissipating-side frame 6-2, a first space 11 is defined in a flattened form on a side of the supply pipe 9 relative to the distributing member 7, a second space 13 is defined in a flattened form on a side of the heat-dissipating-side heat-exchanging base 4 relative to the distributing member 7, and a drain channel 12 is formed communicating the second space 13 to the drain pipe 10.

The heat-dissipating-side frames 6-1,6-2 are formed of a synthetic resin having low water absorption and water vapor permeation, for example, PPS (polyphenylene sulfide; water absorption: 0.02%, water vapor permeation: 2.5 g/m$^2 \cdot$24 hr/0.1 mm), PBT (polybutylene terephthalate; water absorption: 0.07%, water vapor permeation: 6.9 g/m$^2 \cdot$24 hr/0.1 mm) or PP (polypropylene; water absorption: 0.01%, water vapor permeation: 1.5–3.0 g/m$^2 \cdot$24 hr/0.1 mm). If frames having high water vapor permeation were used, dew would be formed on electrode surfaces or the like especially on the heat-absorbing side (low-temperature side), causing short circuiting, electrode corrosion, increased thermal resistance or the like. As the material for the heat-dissipating-side frame and the heat-absorbing-side frame, one having low water vapor permeation is therefore chosen in the present invention.

In this embodiment, the heat-dissipating-side frames 6-1, 6-2 both use polyphenylene sulfide (PPS) with a filler such as glass fibers mixed and dispersed at a content of 20 to 70 wt. %, preferably 30 to 70 wt. % because the filler-reinforced PPS has low water vapor permeation and thermal conductivity and has a linear expansivity close to that of the semiconductor of the group of thermoelectric elements 3. A content of a filler, such as glass fibers, smaller than 20 wt. % leads to large linear expansivity, whereas a content greater than 70 wt. % results in poor moldability. It is therefore necessary to control the content within a range of from 20 to 70 wt. %.

With PPS containing 30–60 wt. % of glass fibers, the coefficient of linear expansion can be controlled within a range of 18 to 23×10$^{-6}$/° C. in a direction of mold flow. This value is approximately the same as the coefficients of linear expansion of the semiconductor material (16 to 22×10$^{-6}$/° C.) and the coefficient of linear expansion of aluminum employed as the heat-exchanging bases (22 to 23×10$^{-6}$/° C.). The thermal conductivity of such glass-fiber-reinforced PPS is as low as 0.28 to 0.49 [Kcal/m·h·° C.].

As is shown in FIG. 1, water 15 as a heat transfer medium spreads in all directions within the first space 11 when supplied through the central supply pipe 9. The water is then strongly injected through the respective nozzles 7e (distributing holes 7d) toward the upper surface of the heat-dissipating-side heat-exchanging base 4. The water 15, which has hit the heat-dissipating-side heat-exchanging base 4 and has absorbed heat from the heat-dissipating-side heat-exchanging base 4, spreads in the narrow second space 13, flows through the drain channel 12 and is then drained out of the system through the drain pipe 10. The drained water 15 is cooled through an unillustrated radiator or by self-cooling and is then used again through a forced circulation system.

Designated at numeral 28 in FIG. 1 is a heat insulator, which is arranged to cover outer peripheral portions of the first heat-dissipating-side frame 6-1, the heat-dissipating-side heat-exchanging base 4 and the second heat-dissipating-side frame 6-2. This heat insulator 28 is also applied to the thermoelectric apparatus according to the other embodiments, but the illustration of the heat insulator 28 is omitted in the drawings of the other embodiments in order to simplify the drawings. It is to be noted that the heat insulator 28 is not absolutely required.

In this embodiment, the first heat-dissipating-side frame 6-1 and the second heat-dissipating-side frame 6-2 are arranged as discrete elements. It is however possible to form the first heat-dissipating-side frame 6-1 and the second heat-dissipating-side frame 6-2 into an integral unit or to form the heat-dissipating-side heat-exchanging base 4 and the second heat-dissipating-side frame 6-2 into an integral unit.

Figure 4:
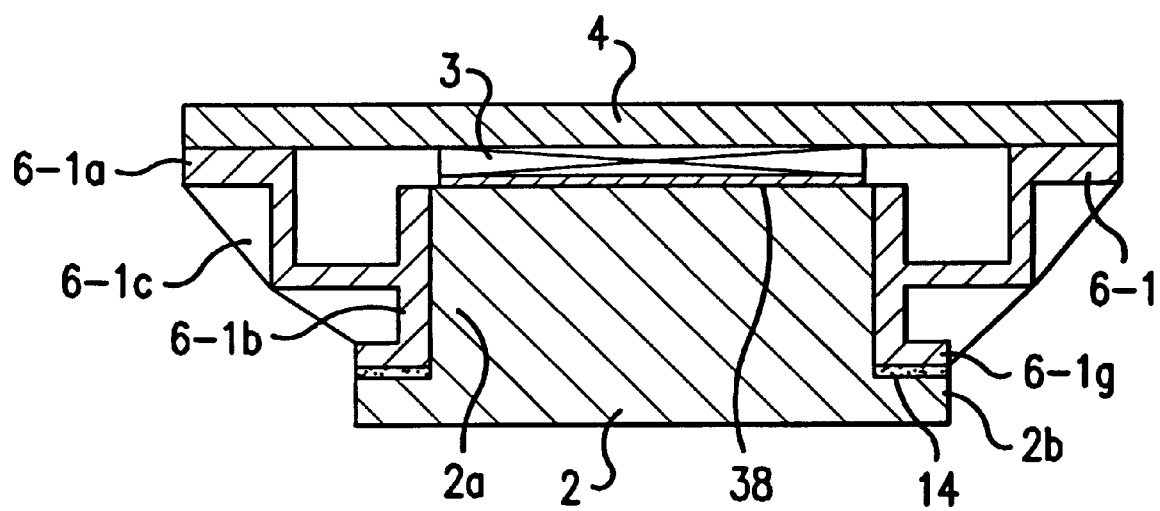
FIG. 4 is a partly cross-sectional view of a thermoelectric apparatus according to a second embodiment of the present invention.

Referring next to FIG. 4, the thermoelectric apparatus according to the second embodiment of the present invention will be described.

In this embodiment, an extended portion 2a of a heat-absorbing-side heat-exchanging base 2 is formed into a horizontally-extending outer flange portion 2b. On the other hand, an extended portion 6-1b of a first heat-dissipating-side frame 6-1 is also formed at a lower part thereof into an outer flange portion 6-1g. An adhesive layer 14 is interposed between both the outer flange portions 2b and 6-1g, so that the extended portion 2a of the heat-absorbing-side heat-exchanging base 2 and the extended portion 6-1b of the first heat-dissipating-side fame 6-1 are integrally joined together.

The adhesive layer 14 is arranged substantially in parallel with the extended portion 2a in the above-described first embodiment and is disposed substantially at a right angle relative to the extended portion 2a in the second embodiment. The extended portions 2a, 6-1b can be modified in shape so that the adhesive layer 14 extends obliquely relative to the extended portion 2a.

Figure 5:
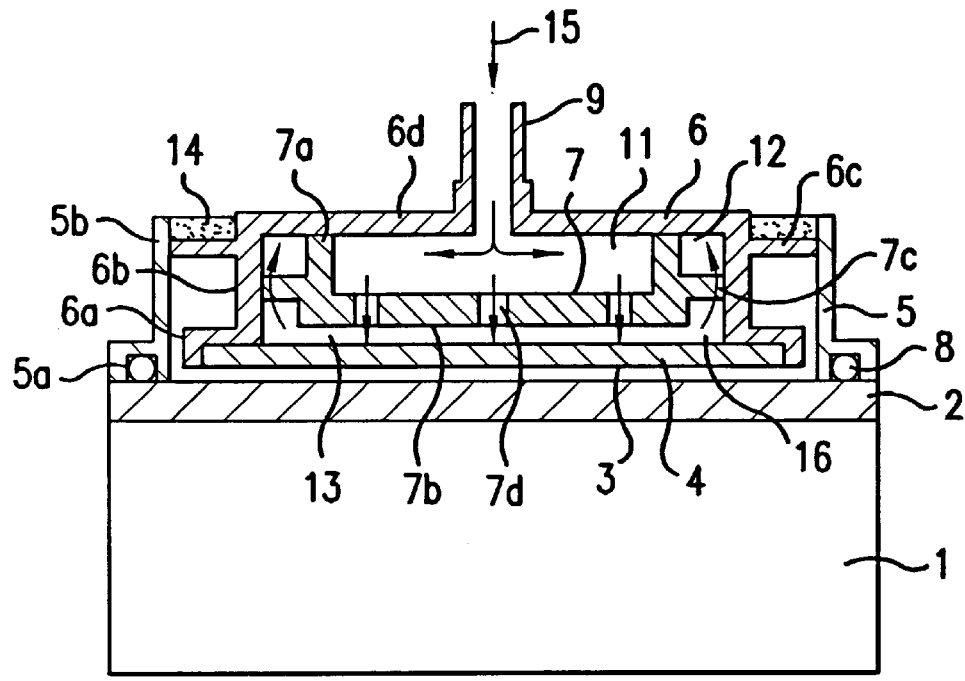
FIG. 5 is a partly cross-sectional view of a thermoelectric apparatus according to a third embodiment of the present invention.

The thermoelectric apparatus according to the third embodiment of the present invention will be described with reference to FIG. 5.

The thermoelectric apparatus is composed principally of a heat-absorbing member 1 to be arranged on a cooled side, a heat-absorbing-side heat-exchanging base 2, a group of thermoelectric elements 3, a heat-dissipating-side heat-exchanging base 4, a heat-absorbing-side frame 5, a heat-dissipating-side frame 6, and a distributing member 7.

The heat-absorbing-side frame 5 is in the form of a hollow shape open through top and bottom parts thereof, has a basal end portion 5a and an extended portion 5b extending upwardly from an inner peripheral portion of the basal portion 5a, and has a substantially L-shaped cross-section. Formed in a lower surface of the basal end portion 5a is a groove in which an O-ring 8 is received, whereby the lower surface of the basal end portion 5a is joined in a liquid-tight fashion to a peripheral portion of the heat-absorbing-side heat-exchanging base 2.

The heat-dissipating-side frame 6 is in the form of a hollow shape substantially closed at an upper part thereof but open through a lower part thereof. A peripheral edge portion of a lower opening is provided with a base receiving portion 6a to which a peripheral portion of the heat-dissipating-side heat-exchanging base 4 is bonded in a liquid-tight fashion. An extended portion 6a is arranged extending upwardly from an inner peripheral portion of the base receiving portion 6a. In a vicinity of an upper extremity of the extended portion 6b, an adhesive receiving portion 6c is formed extending outwardly so that the adhesive receiving portion 6c is maintained in contact with an inner surface of the extended portion 5b of the heat-absorbing-side frame 5.

A closed portion 6d is formed extending inwards from the upper extremity of the extended portion 6b. The closed portion 6a is provided at substantially a central part thereof with a supply pipe 9 and adjacent to a peripheral edge thereof with a drain pipe (not shown).

The distributing member 7 is integrally formed of a peripheral wall 7a, a bottom wall 7b extending inwards from a lower extremity of the peripheral wall 7a, and a flange portion 7c extending outwards from a vertically middle position of the peripheral wall 7a. The bottom wall 7b is provided with a number of distributing holes 7d which extend in the direction of the thickness of the bottom wall 7b. Further, drain holes of a relatively large diameter (not shown) are formed through the flange portion 7c in four corners thereof.

At an upper surface of the peripheral wall 7a and an outer peripheral surface of the flange portion 7c, the distributing member 7 is bonded in a liquid-tight fashion to an inner surface of the closed portion 6d and an inner peripheral surface of the extended portion 6b of the heat-dissipating-side frame 6, respectively. As a result of the bonded fixing of the distributing member 7 within the heat-dissipating-side frame 6, a first space 11 is defined in a flattened form by the peripheral wall 7a and the bottom wall 7b of the distributing member 7 and the closed portion 6d of the heat-dissipating-side frame 6, a drain channel 12 is formed in communication with the drain holes by the peripheral wall 7a and the flange portion 7c of the distributing member 7, a part of the extended portion 6b and a part of the closed portion 6d of the heat-dissipating-side frame 6, and a second space 13 is defined in a flattened form between the bottom wall 7b of the distributing member 7 and the heat-dissipating-side heat-exchanging base 4.

As is illustrated in the drawing, the heat-absorbing-side heat-exchanging base 2, the group of thermoelectric elements 3 and the heat-dissipating-side heat-exchanging base 4 are stacked one over the other in the vertical direction so that they are arranged in a contiguous relationship. The extended portion 5b of the heat-absorbing-side frame 5, which is connected to the heat-absorbing-side heat-exchanging base 2, and the extended portion 6b of the heat-dissipating-side frame 6, which is connected to the heat-dissipating-side heat-exchanging base 4, extend in substantially the same direction on a heat-dissipating side of the group of thermoelectric elements 3. Further, the extended portion 5b and the extended portion 6b are joined together in a gas- and liquid-tight fashion by injecting an adhesive 14, for example, an epoxy adhesive into a recess, which is formed by parts of the extended portions 5b, 6b and the adhesive receiving portion 6c, and then solidifying the adhesive 14 there.

The manner of flowing of water 15 is substantially the same as that in the first embodiment, and its description is omitted. In this embodiment, the recess into which the adhesive 14 is injected can be formed deeper, and the extended portions 5b,6b can made gradually greater in thickness in a downward direction so that the distance between the mutually-opposing surfaces of the extended portions 5b, 6b becomes gradually smaller in the downward direction.

Figure 6:
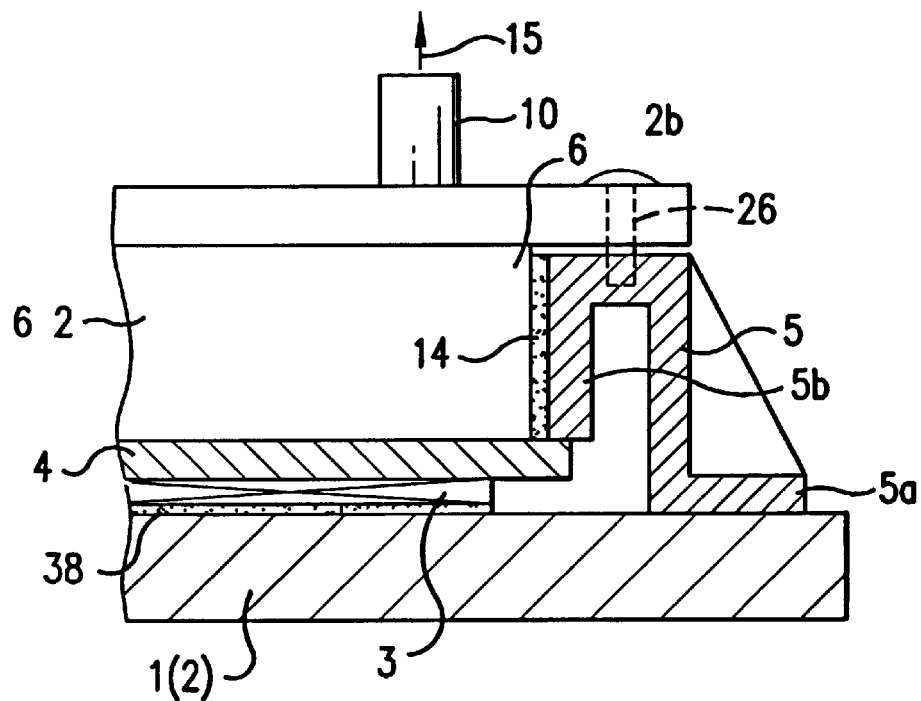
FIG. 6 a partly cross-sectional view of a thermoelectric apparatus according to a fourth embodiment of the present invention.

FIG. 6 illustrates the fourth embodiment of the present invention. According to this embodiment, a extended portion 5b of a heat-absorbing-side frame 5 is arranged in a turned-back form (non-linear form), positioning pins 26 are arranged extending across the heat-absorbing-side frame 5 and the heat-dissipating-side frame 6, and the heat-absorbing-side frame 5 and the heat-dissipating-side frame 6 are integrally joined together with an adhesive layer 14. The arrangement of the extended portion 5b in the turned-back form provides the extended portion 5b with a longer creeping distance, thereby making it possible to reduce the return of heat through the heat-absorbing-side frame 5.

In this embodiment, a group of thermoelectric elements 3 is joined to a heat-absorbing member 1 as a fine base with or without a thin film 38 interposed therebetween.

Figure 7:
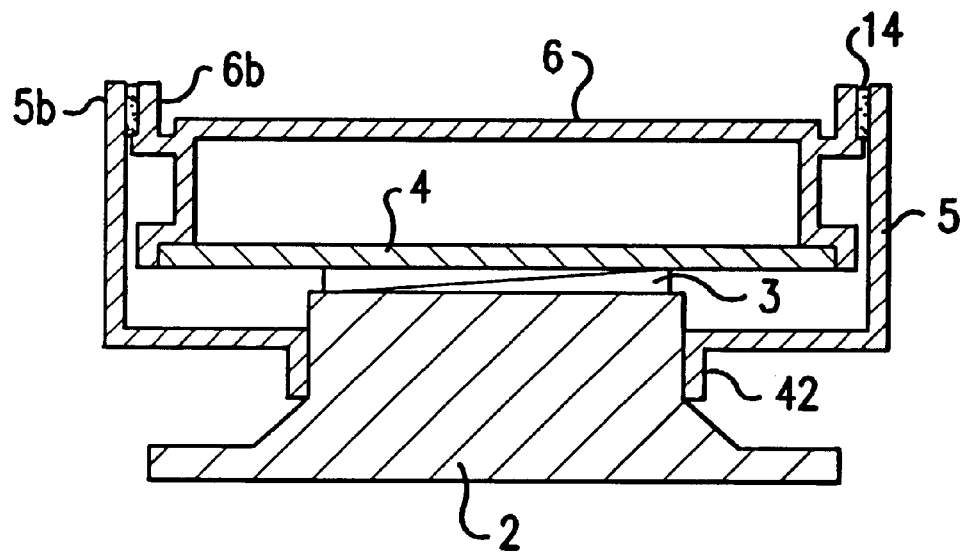
FIG. 7 a partly cross-sectional view of a thermoelectric apparatus according to a fifth embodiment of the present invention.
Figure 8:
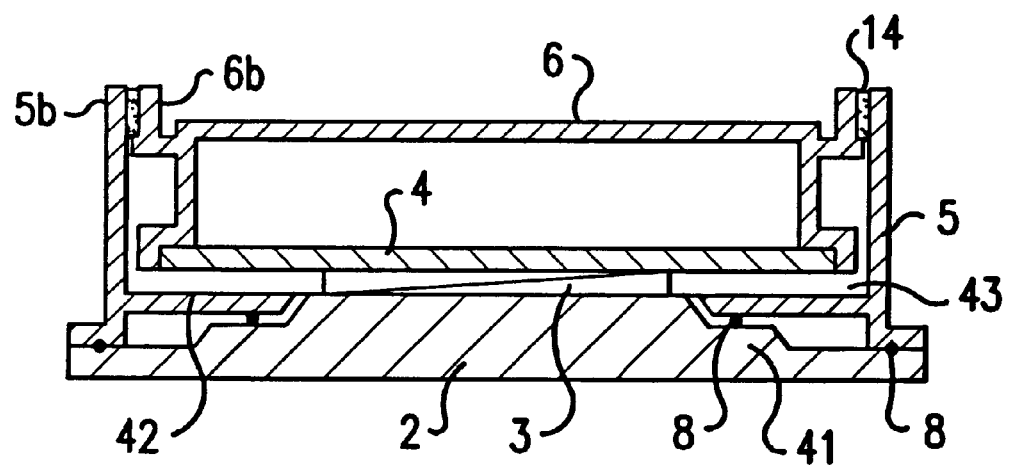
FIG. 8 a partly cross-sectional view of a thermoelectric apparatus according to a sixth embodiment of the present invention.

In the construction that a heat-absorbing-side heat-exchanging base 2 and a heat-dissipating-side heat-exchanging base 4 are arranged opposite to each other, there is a potential problem of a reduction in the efficiency of thermoelectric conversion because heat returns from the heat-dissipating-side heat-exchanging base 4 to the heat-absorbing-side heat-exchanging base 2 as mentioned above. FIGS. 7 and 8 show specific examples designed in view of this potential problem. It is to be noted that other members such as the heat-absorbing member 1 and the distributing member 7 are omitted in these drawings for their simplification.

FIG. 7 illustrates the fifth embodiment of the present invention. To make the surface area of a heat-absorbing-side heat-exchanging base 2 smaller on a side opposing heatdissipating-side heat-exchanging base 4 and greater on a side joined to a heat-absorbing member (see FIG. 1), the heat-absorbing-side heat-exchanging base 2 is provided on the side of the heat-absorbing member 1 with an enlarged portion. Further, the heat-absorbing-side heat-exchanging base 2 is covered at a side wall thereof by a thermal transfer cutoff portion 42 which extends out from a heat-absorbing-side frame 5.

FIG. 8 depicts the sixth embodiment of the present invention. In this embodiment, a heat-absorbing-side heat-exchanging base 2 is formed into a stepped portion 41 of one or plural steps between a central portion of the base 2, where the base is maintained in close contact with a group of thermoelectric elements 3, and a peripheral edge portion of the base 2 so that the heat-absorbing-side heat-exchanging base 2 has a mountain-like shape in cross-section. The provision of the stepped portion 41 has made it possible to place the heat-absorbing-side heat-exchanging base 2 as apart as possible from the heat-dissipating-side heat-exchanging base 4 at the peripheral edge portion other than the central portion where the base 2 is opposite to the group of thermoelectric element 3, whereby the return of heat to the peripheral edge portion of the heat-absorbing-side heat-exchanging base 2 can be reduced.

In addition, a thermal barrier 43 is formed on a peripheral portion of the heat-dissipating-side heat-exchanging base 4 and a surface of the thermal transfer cutoff portion 42. This thermal barrier 43 is formed, for example, of short fibers (fiber length: 0.5 to 1 mm or so) such as polyamide fibers, polyester fibers, polyacrylonitrile fibers, polyolefin synthetic fibers or fluorine-containing synthetic fibers; bonded fine powder such as alumina, glass, diatomaceous earth or titanium oxide; or a heat-insulating tape (sheet) with an adhesive coated on one side thereof.

As an alternative, this thermal barrier 43 can be arranged on the heat-absorbing-side heat-exchanging base 2 or on a surface of the thermal transfer cutoff portion 42, said surface opposing said heat-absorbing-side heat-exchanging base 2.

As a heat-insulating layer, it is also possible to fill a material having thermal conductivity lower than air, for example, superfine particles of a metal oxide such as titanium oxide or a gas such as argon gas in a space between the heat-absorbing-side heat-exchanging base 2 and the heat-dissipating-side heat-exchanging base 4.

In the above-described fifth and sixth embodiment, the extended portion 5b of the heat-absorbing-side frame 5 and the extended portion 6b of the heat-dissipating-side frame 6 are both extended to the heat-dissipating side of the group of thermoelectric elements 3. It is however possible to have both the extended portions 5b and the extended portion 6b to the heat-absorbing side of the group of thermoelectric elements 3.

In each of the above-described embodiments, the extended portions are joined together by the adhesive layer 14. Their joining method is however not limited to the use of the adhesive layer 14. Other joining methods such as ultrasonic bonding, bolted fastening and a combination thereof can also be used.

When the efficiency of assembling work of the thermoelectric apparatus according to each of the above-described embodiment is taken into consideration, it is preferred to mount the group of thermoelectric elements 3 on one of the heat-exchanging bases (for example, the heat-dissipating-side heat-exchanging base 4) via a solder layer or an adhesive layer and to bring the other heat-exchanging base (for example, the heat-absorbing-side heat-exchanging base 2) into contact with the group of thermoelectric elements 3 either directly or via a layer or member of good thermal conductivity.

Figure 9:
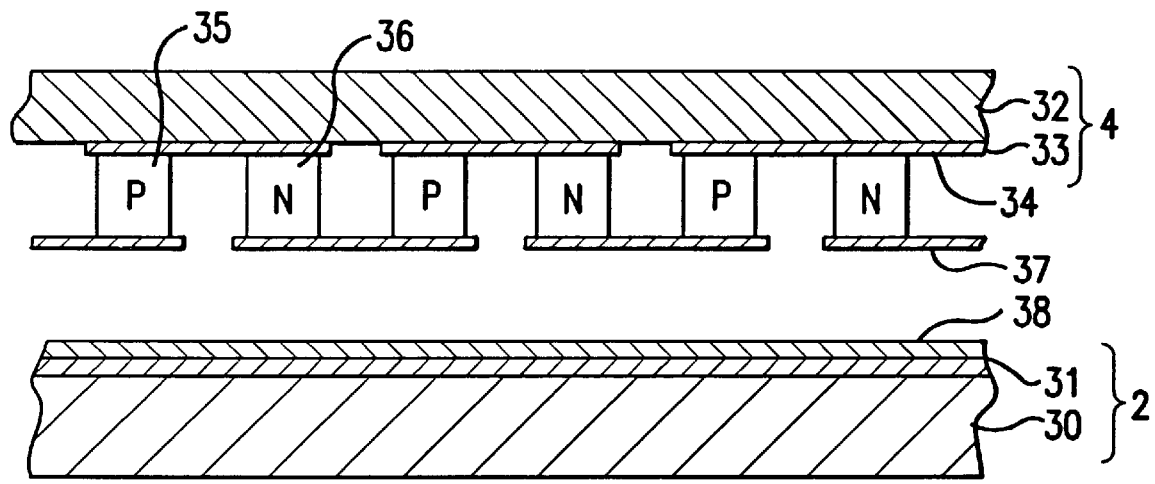
FIG. 9 is a partly cross-sectional view of a thermoelectric apparatus according to a seventh embodiment in the course of its assembling.

The cross-sectional view of FIG. 9 illustrates the seventh embodiment in the course of its assembly. The above-described improvement to the fabrication process has been incorporated in this embodiment. In this embodiment, a heat-absorbing-side heat-exchanging base 2 is composed of a metal plate 30, such as an aluminum plate, with an electrical insulating film 31 of anodized alumina or the like formed on one side of the metal plate 30. On the other hand, the heat-dissipating-side heat-exchanging base 4 is also composed of a metal plate 32, such as an aluminum plate, with an electrical insulating film 33 of anodized alumina or the like formed on one side of the metal plate 32.

As is shown in the drawing, heat-dissipating-side electrodes 34 are bonded with solder or the like on the electrical insulating film 33 which is formed on the heat-dissipating-side heat-exchanging base 4. Further, P-type semiconductor layers 35 and N-type semiconductor layers 36 are bonded with solder or the like on the heat-dissipating-side electrodes 3. In addition, heat-absorbing-side electrodes 37 are bonded with solder or the like on the P-type semiconductor layers 35 and the N-type semiconductor layers 36. A group of thermoelectric elements 3 is constructed of the heat-dissipating-side electrodes 34, the P-type semiconductor layers 35, the N-type semiconductor layers 36 and the heat-absorbing-side electrodes 37. The group of thermoelectric elements 3 is in turn mounted on the heat-dissipating-side heat-exchanging base 4 as described above.

On the electric insulating film 31 formed on the heat-dissipating-side heat-exchanging base 2, on the other hand, a thin film 38 having high thermal conductivity and also provided with flexibility and elasticity is formed over an area somewhat broader than an area of the group of thermoelectric elements 3. As this thin film 38, an organic material containing a fine filler mixed and dispersed therein and having rubber elasticity is usable. In this embodiment, a gel-like silicone rubber [(for example, "SE4440" (trade name, product of Dow Corning Toray Silicone Co., Ltd.)] with a fine filler mixed and dispersed therein is used. As post-hardening properties of this silicone gel, it has a thermal conductivity as high as $1.8 \times 10^{-3}$ (cal/cm·° C.·sec), a penetration is 60 (as measured by JIS K2220), and good gel elasticity. Incidentally, the adequate thickness of the thin film 38 is 500 μm or less.

As has been described above, the heat-absorbing-side heat-exchanging base 2 can be thermally connected with ease and surety to the group of thermoelectric elements 3 via the thin film 38 of good thermal conductivity by mounting the group of thermoelectric elements 3 on the heat-dissipating-side heat-exchanging base 4, providing one of the heat-exchanging bases, namely, the heat-absorbing-side heat-exchanging base 2 with the elastic thin film 38, and then bringing the heat-absorbing-side heat-exchanging base 2 and the heat-dissipating-side heat-exchanging base 4 closer to each other to press the group of thermoelectric elements 3 against the thin film 38.

Figure 10:
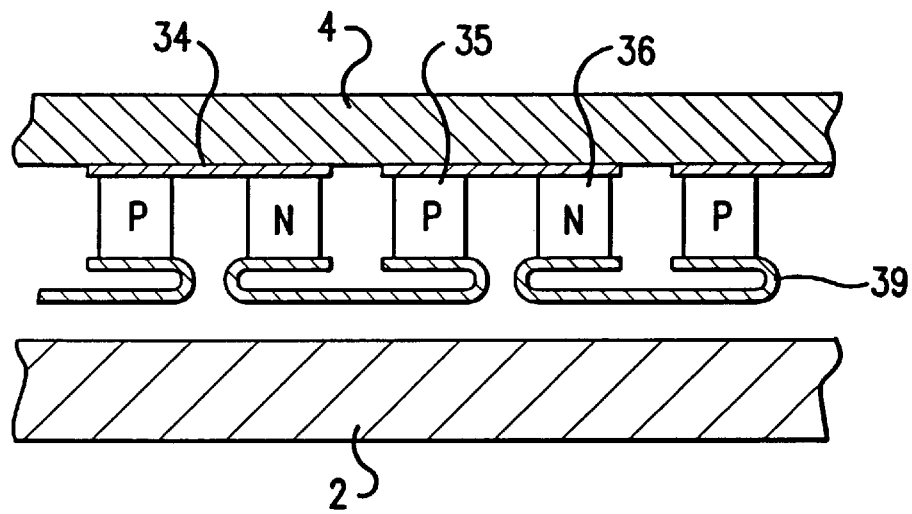
FIG. 10 is a partly cross-sectional view of a thermoelectric apparatus according to an eighth embodiment in the course of its assembling.

FIG. 10 illustrates the eighth embodiment of the present invention. Stress-absorbing members 39 are used instead of the heat-absorbing-side electrodes 37. These stress-absorbing members 39 are made of a resilient material having good thermal conductivity and electrical conductivity, such as aluminum or copper and are each bent into U shapes at opposite ends thereof. Each stress-absorbing member can also be bent into Z shapes or S shapes instead of the U shapes.

The stress-absorbing members 39, which are bent in the U shapes, Z shapes or S shapes as described above, can undergo elastic deformation in the stacked direction of the heat-absorbing-side heat-exchanging base 2, the group of thermoelectric elements 3 and the heat-dissipating-side heat-exchanging base 4 and in a direction perpendicular to the stacked direction (in other words, in both vertical and horizontal directions as viewed in the drawing). The provision of the stress-absorbing members 39 can therefore effectively absorb stress which occurs in the stacked direction and in the direction perpendicular to the stacked direction through repeated heat cycles, so that the thermoelectric elements 3 can be protected from adverse effects of such stress. Further, the provision of the stress-absorbing members 39 makes it possible to increase the distance between the heat-absorbing-side heat-exchanging base 2 and the heat-dissipating-side heat-exchanging base 4 so that the heat loss in spaces other than the semiconductor layers 35,36 can be reduced.

The eighth embodiment has been described using as an example the thermoelectric apparatus which employs, as the heat-absorbing-side heat-exchanging base 2 and the heat-dissipating-side heat-exchanging base 4, the metal plates 30,32 (such as aluminum plates) with electrical insulating films 31,33 (such as anodized alumina films) formed on one sides of the metal plates 30,32. Compared with bases made of ceramics such as alumina, the bases 2,4 has merits such that they have lower thermal resistance and cause less damages on the group of thermoelectric elements 3 when a heat cycle is repeated. The above-mentioned electrical insulating films 31,33 of anodized alumina are formed by anodization or the like.

Perfect formation of the electrical insulating films 31,33 on the surfaces of the metal plates 30,32, however, is accompanied by drawbacks that high fabrication cost and long fabrication time are required.

Figure 11:
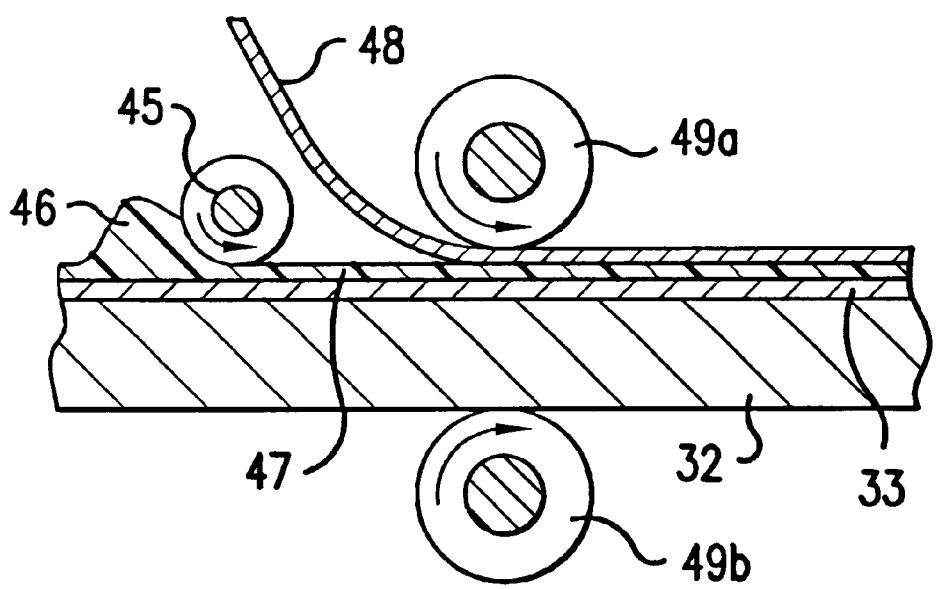
FIG. 11 is a cross-sectional view showing a fabrication process of a heat-dissipating-side heat-exchanging base for use in a thermoelectric apparatus according to a ninth embodiment.
Figure 12:
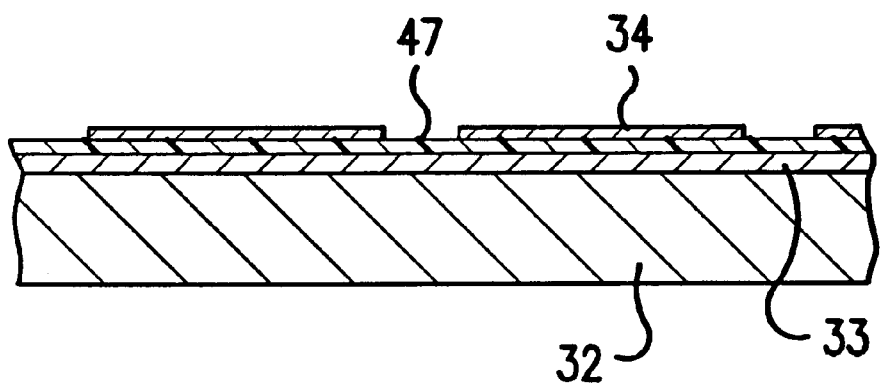
FIG. 12 is a cross-sectional view of the heat-dissipating-side heat-exchanging base.

FIG. 11 and FIG. 12 illustrate the ninth embodiment which has been designed in view of the above-mentioned drawbacks. FIG. 11 illustrates a fabrication process of a base 2(4), while FIG. 12 depicts the base 2(4) in cross-section.

First, an electrical insulating film 33(31) of aluminum or the like is formed by anodization on one side of a metal plate 32(30) of aluminum or the like. A resin-base coating formulation 46 is then applied to a uniform thickness on the electrical insulating film 33(31) by a coating roller 45, whereby a resin coating 47 is formed. The resin coating 47 can also be formed by another method such as spin coating or printing, although the coating roller 45 is used in this specific embodiment.

For the resin-base coating formulation 46, a variety of synthetic resins are usable including, for example, polyimide resins, polyamide resins, polyester resins, acrylic resins, vinyl resins, polyolefin resins, cellulose resins and rubbery resins. In view of its application to the heat-dissipating-side heat-exchanging base 4, a thermoplastic resin having heat resistance such as a polyimide, polyamide-imide or polyester resin is particularly preferred.

It is desired to limit the thickness of the resin coating 47 to a range of from 1 to 20 $\mu$m, preferably a range of from 3 to 10 $\mu$m. A coating thickness smaller than 1 $\mu$m results in the formation of pinholes in the resin coating 47, so that the resin coating 47 cannot exhibit its function to supplement electrical insulation. A coating thickness greater than 20 $\mu$m, on the other hand, leads to an increase in thermal resistance by the resin coating 47. Coating thicknesses outside the above range are therefore not preferred. In this embodiment, a resin coating made of a polyimide resin and having a thickness of about 5 $\mu$m is used as the resin coating 47.

To use the metal plate 30 with the resin coating 47 formed thereon as the heat-absorbing-side heat-exchanging base 2, the metal plate 30 is cut into a predetermined size and is then used, as is, as the heat-dissipating-side heat-exchanging base 2.

FIG. 11 and FIG. 12 illustrate the case that the metal plate 32 with the resin coating 47 formed thereon is used as the heat-dissipating-side heat-exchanging base 4. An electrode material 48—which is in the form of a foil and is made of copper, for example—is stuck over the resin coating 47. They are compressed together under heat through hot pressure rollers 49a, 49b, whereby the electrode material 48 is bonded and fixed on the metal plate 32 by making use of the heat fusion property of the resin coating 47.

The thus-formed composite material, which consists of the metal plate 32 with the electrical insulating film 33 formed thereon, the resin coating 47 and the electrode material 48, is cut into a predetermined size. The electrode material 48 is then subjected to etching treatment so that unnecessary parts are removed to pattern the electrode material 48 into a predetermined shape. Nickel plating is then applied to the surface of the remaining electrode material, whereby heat-dissipating-side electrodes 34 are formed as shown in FIG. 12. After that, P-type semiconductor layers 35 and N-type semiconductor layers 36 are united onto the respective heat-dissipating-side electrodes 34 by a method commonly known in the present field of art.

In this embodiment, the electrode material 48 has been used. As an alternative, the individual heat-dissipating-side electrodes 34 can be fixed by arranging discrete pieces of an electrode material, which have been cut into a predetermined shape beforehand, in a predetermined pattern on the resin coating 47 and then uniting them to the metal plate 32 under heat and pressure.

It is possible to reduce the fabrication cost if, as in this embodiment, the resin coating 47 is used not only to supplement the electrical insulating film 33 but also to fix the heat-dissipating-side electrodes 34.

Figure 13:
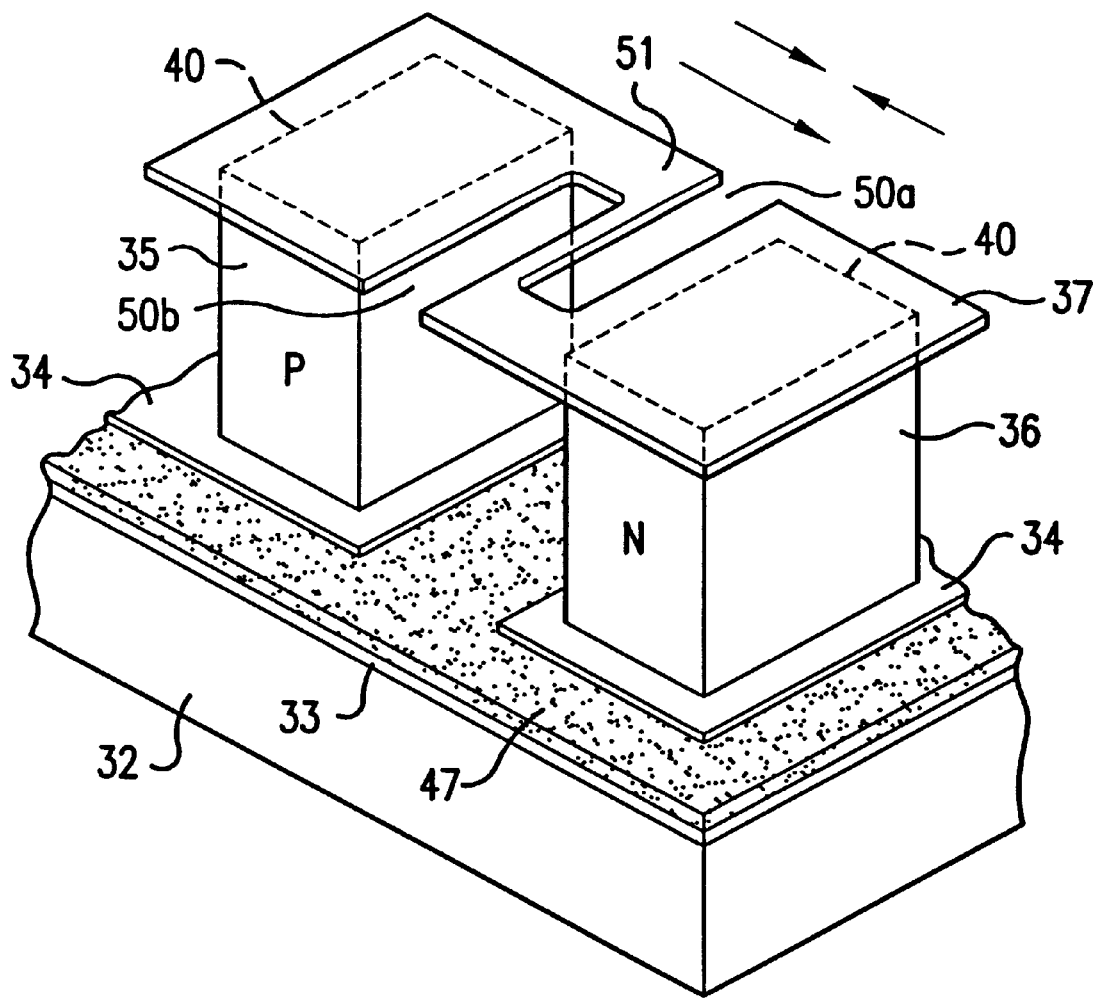
FIG. 13 is a fragmentary perspective view of a thermoelectric apparatus according to a tenth embodiment of the present invention.

Reference is next had to FIG. 13, which illustrates the tenth embodiment of the present invention. This tenth embodiment has been designed with a view to achieving stress relaxation in a horizontal direction. As is shown in the drawing, an electrical insulating film 33 is formed on a metal plate 32, and heat-dissipating-side electrodes 34 are united on the metal plate 32 optionally with a resin coating 47 interposed therebetween. Further, P-type semiconductor layers 35 and N-type semiconductor layers 36 are united to the heat-dissipating-side electrodes 34, and heat-absorbing-side electrodes 37 are then united to the semiconductor layers 35,36.

Each heat-absorbing-side electrode 37 is provided in both halves thereof with areas 40,40 where the electrode 37 is united to the associated P-type semiconductor layer 35 and the N-type semiconductor layer 36, respectively. Between these areas 40,40, a first notch 50a and a second notch 50b are formed in parallel with each other in such a way that the first and second notches 50a, 50b extend in a staggered relationship from opposite side edges of the heat-absorbing-side electrode 37, respectively.

Owing to elongation and shrinkage of an S-shaped part 51 formed between the areas 40,40, horizontal stress can be absorbed as indicated by arrows in the drawing.

Figure 14:
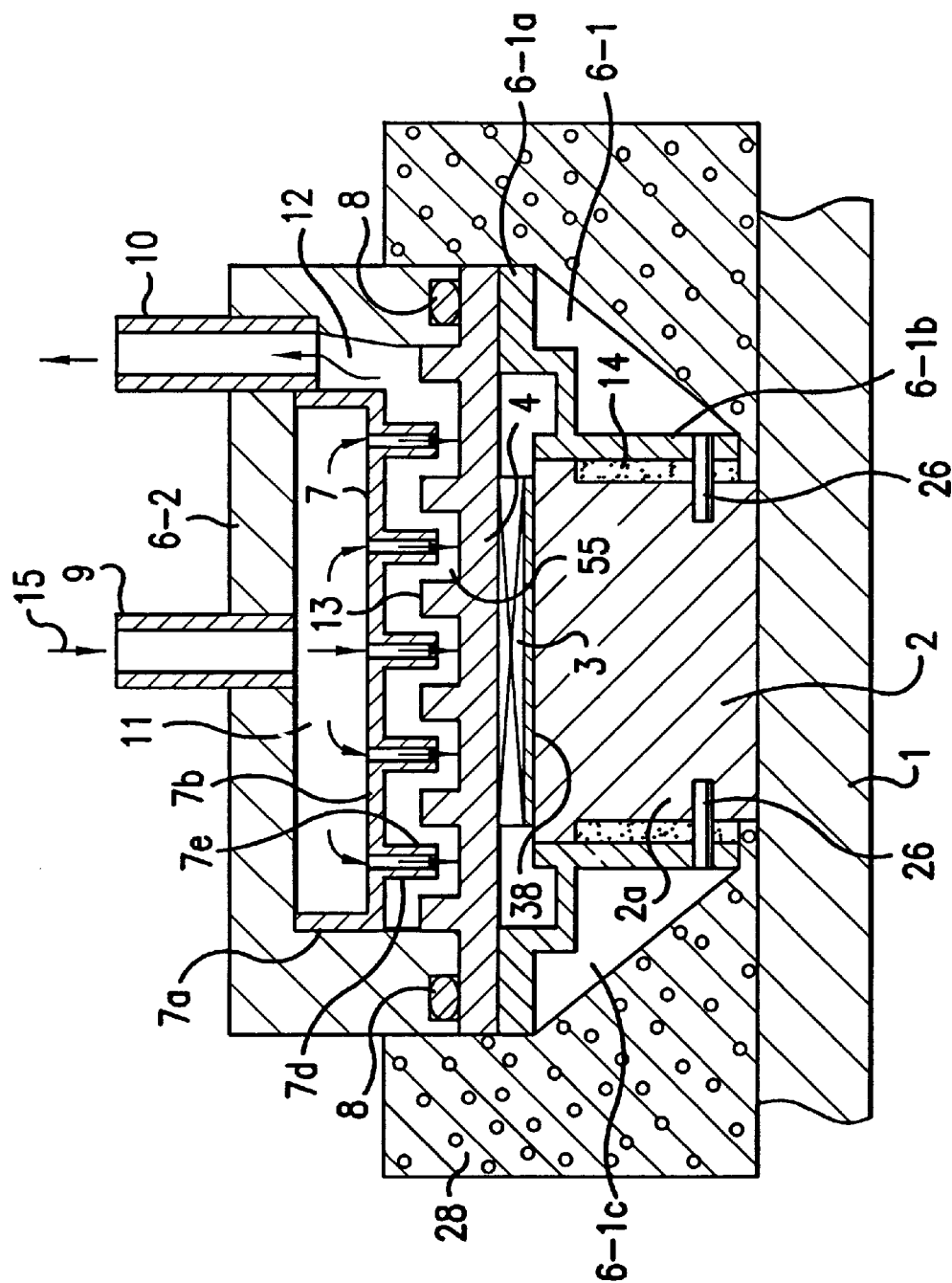
FIG. 14 is a cross-sectional view of a thermoelectric apparatus according to an eleventh embodiment of the present invention.

FIG. 14 illustrates the eleventh embodiment of the present invention, which is different from the first embodiment shown in FIG. 1 in that recesses 55 are formed in opposition to respective nozzles 7e on a side of a distributing member 7 relative to the heat-dissipating-side heat-exchanging base 4. The provision of such numerous recesses 55 as described above can increase the surface area of the heat-exchanging base 4 and can hence contribute to an improvement in the performance.

The above embodiments have been described assuming that they are employed as thermoelectric cooling apparatuses. It is to be noted that the present invention is also applicable to thermoionic electricity generators.

Having now fully described the invention, it will be apparent to one of ordinary skill in the art that many changes and modifications can be made thereto without departing from the spirit or scope of the invention as set forth herein.

What is claimed is:

1. A thermoelectric apparatus comprising:
   a first heat-exchanging base and a second heat-exchanging base arranged in a mutually opposing relationship with a group of thermoelectric elements interposed therebetween:
      a frame made of a synthetic resin material and joined with an outer peripheral portion of said first heat-exchanging base such that said frame surrounds an outer peripheral portion of said second heat-exchanging base,
      a base-side extended portion arranged on said outer peripheral portion of said second heat-exchanging base such that said base-side extended portion extends substantially in a stacked direction of said first heat-exchanging base, said group of thermoelectric elements and said second heat-exchanging base, and
      a frame-side extended portion arranged on said frame such that said frame-side extended portion extends in substantially the same direction as said base-side extended portion and is located opposite said base-side extended portion with a space interposed therebetween,
   wherein said second heat-exchanging base is inserted in said frame, said outer peripheral portion of said second heat-exchanging base is at a part thereof in contact with a part of an inner peripheral portion of said frame, and said base-side extended portion and said frame-side extended portion are bonded together with an adhesive layer formed by pouring an adhesive into said space between said base-side extended portion and said frame-side extended portion, and
   a free end portion of said frame-side extended portion and said adhesive layer remain out of contact with a heat-conductive member when said heat-conductive member is brought into contact with a side of said second heat-exchanging base, said side being located opposite said group of thermoelectric elements.

2. A thermoelectric apparatus according to claim 1, wherein said second heat-exchanging base is in the form of a thick block, and an outer peripheral portion of said block forms said extended portion.

3. A thermoelectric apparatus according to claim 1, further comprising positioning pins extending through said extended portions.

4. A thermoelectric apparatus according to claim 1, wherein said adhesive layer is formed substantially in parallel with said extended portions.

5. A thermoelectric apparatus according to claim 1, wherein each frame is made of a material having a low thermal conductivity.

6. A thermoelectric apparatus according to claim 1, wherein each frame is made of a material having a low water vapor permeation.

7. A thermoelectric apparatus according to claim 1, further comprising a power supply member for feeding electric power to said group of thermoelectric elements, said power supply member being held by said frame.

8. A thermoelectric apparatus according to claim 1, wherein said frame extends in a non-linear shape between a basal end portion of said frame, said basal end portion being joined with said first heat-exchanging base, and said extended portion of said frame.

9. A thermoelectric apparatus according to claim 1, further comprising reinforcing ribs arranged between a basal end portion of said frame, said basal end portion being joined with said first heat-exchanging base, and said extended portion of said frame.

10. A thermoelectric apparatus according to claim 1, further comprising a thermal transfer cutoff portion arranged between said first heat-exchanging base and said second heat-exchanging base.

11. A thermoelectric apparatus according to claim 10, wherein said thermal transfer cutoff portion is formed integrally with said frame.

12. A thermoelectric apparatus according to claim 1, further comprising a thermal barrier arranged on one of mutually-opposing surfaces of said first heat-exchanging base and said second heat-exchanging base.

13. A thermoelectric apparatus according to claim 1, further comprising a resilient stress-absorbing member disposed in said group of thermoelectric elements.

14. A thermoelectric apparatus according to claim 1, further comprising an elastic thin film interposed between said group of thermoelectric elements and one of said first and second heat-exchanging bases.

15. A thermoelectric apparatus according to claim 12, wherein said thin film is made of a silicone gel having a high thermal conductivity.

16. A thermoelectric apparatus according to claim 1, wherein one of said first and second heat-exchanging bases is a fin base.

17. A thermoelectric apparatus according to claim 1, wherein said first and second heat-exchanging bases are heat-absorbing-side and heat-dissipating-side heat exchange bases, respectively.

* * * * *